US012185065B2

United States Patent
Weed et al.

(10) Patent No.: US 12,185,065 B2
(45) Date of Patent: Dec. 31, 2024

(54) METHOD FOR SUPPRESSING VIBRATION COUPLED SIGNALS IN A MICROPHONE FOR FLIGHT RECORDERS

(71) Applicant: L3 Technologies, Inc., New York, NY (US)

(72) Inventors: Michael E. Weed, Nokomis, FL (US); William N. Waggener, Sarasota, FL (US)

(73) Assignee: L3HARRIS AVIATION PRODUCTS, INC., Grand Rapids, MI (US)

( * ) Notice: Subject to any disclaimer, the term of this patent is extended or adjusted under 35 U.S.C. 154(b) by 177 days.

(21) Appl. No.: 17/898,256

(22) Filed: Aug. 29, 2022

(65) Prior Publication Data

US 2024/0073599 A1 Feb. 29, 2024

(51) Int. Cl.
*H04R 3/00* (2006.01)
*B64D 45/00* (2006.01)
*B81B 7/02* (2006.01)
*G01P 15/08* (2006.01)
*G10L 21/0208* (2013.01)
*H04R 1/08* (2006.01)

(52) U.S. Cl.
CPC ............ *H04R 3/002* (2013.01); *B81B 7/02* (2013.01); *G01P 15/08* (2013.01); *G10L 21/0208* (2013.01); *H04R 1/083* (2013.01); *B81B 2201/0235* (2013.01); *B81B 2201/0257* (2013.01); *G01P 2015/0865* (2013.01); *H04R 2201/003* (2013.01); *H04R 2430/03* (2013.01); *H04R 2499/13* (2013.01)

(58) Field of Classification Search
None
See application file for complete search history.

(56) References Cited

U.S. PATENT DOCUMENTS

| 11,462,230 | B1 * | 10/2022 | Sztuk | G10L 21/0232 |
| 2013/0208923 | A1 | 8/2013 | Suvanto | |
| 2018/0077507 | A1 | 3/2018 | Castillo et al. | |
| 2020/0194020 | A1 * | 6/2020 | Matsuo | G10L 21/0208 |
| 2022/0101870 | A1 * | 3/2022 | Fernando | G10L 21/057 |

OTHER PUBLICATIONS

Notification of Transmittal of the International Search Report and the Written Opinion of the International Search Authority, or the Declaration dated Dec. 14, 2023 (Dec. 14, 2023), 7 pages, issued on related international patent application PCT/US2023/031242 by the European Patent Office.

* cited by examiner

*Primary Examiner* — Qin Zhu
(74) *Attorney, Agent, or Firm* — DICKINSON WRIGHT PLLC

(57) ABSTRACT

An aircraft recorder system is provided in which a vibration sensor including at least one of a micro-electromechanical systems (MEMS) microphone and a MEMS accelerometer. The system further includes a cockpit voice recorder (CVR) and an active microphone. The active microphone and the vibration sensor each output signals to a signal processor including a subtractor configured to output, to the CVR, a signal that is a result of a subtraction of the signal from the vibration sensor from the signal from the active microphone.

6 Claims, 4 Drawing Sheets

METHOD FOR SUPPRESSING VIBRATION COUPLED SIGNALS IN A MICROPHONE FOR FLIGHT RECORDERS

BACKGROUND

1. Field

Apparatuses and methods consistent with example embodiments relate to aircraft audio recorders, and more particularly to an aircraft audio recorder including a noise canceling configuration.

2. Description of the Related Art

Commercial aircraft typically include an aircraft recorder, sometimes called a "black box," which stores various data related to the current flight of the aircraft. The aircraft recorder may be a flight data recorder (FDR), a cockpit voice recorder, or a combination voice and data recorder, such as a cockpit voice and data recorder (CVDR). The recorded data may be used to analyze aircraft crashes and other incidents. Thus, FDRs and CVDRs often function as a repository of all the data pertinent to the functionality of an aircraft. An FDR or CVDR may record audio from multiple channels including a cockpit channel and one or more pilot channels. The cockpit channel may be obtained from a cockpit voice recorder (CVR) including one or more cockpit area microphones (CAMs) located within the cockpit which record the pilots and crew in the cockpit during a flight, for instance dialog between the pilot and the tower, dialog between the captain and copilot, broadcast from the crew members or an alarm sound in the pilot cabin.

Any undesired noise that comes from a cable or microphone when being moved or handled is referred to as "handling noise", and the handling noise generally comes from physical handling or other movement. When sound reaches a microphone, the diaphragm will move or sense changes in the pressure gradient, thus generating an electric current. When a microphone is moved, a problem arises because the inertia of the microphone diaphragm will make it move briefly. This movement of the microphone diaphragm will generate noise in the audible range that may overload an input device. Handling noise and the resultant distortion recorded by a CVR or other cockpit microphone may create challenges for investigators when analyzing recordings.

CAMs are generally rigidly mounted in cockpit panels, leading to the handling noise and the recorded audio from the cockpit being coupled. In certain applications, an isolation mount may be used to reduce handling noise in a mounted microphone. Such a mount allows microphone equipment to be securely mounted to a foundation and a frame at the same time, allowing it to float independently from the substrate. However, such isolation mounts are often ineffective or limited in their use in aircraft cockpits due to material restrictions inherent to cockpits, such as limitations on flammable materials, smoke, and smoke toxicity.

Some CAM mounting designs use rudimentary elastomeric isolation techniques to mechanically decouple the microphone capsule from the cockpit panels. Larger, legacy electret and dynamic microphones are more susceptible to issues of handling noise. Likewise, pressure gradient designs are more susceptible, while modern capacitive micro-electrical-mechanical systems (MEMS) microphones are less susceptible due to lower transducer mass.

SUMMARY

Example embodiments may address at least the above problems and/or disadvantages and other disadvantages not described above. Also, example embodiments are not required to overcome the disadvantages described above, and may not overcome any of the problems described above.

One or more example embodiments may provide an aircraft recorder system comprising: a cockpit voice recorder (CVR); an active microphone; a vibration sensor communicatively co-mounted with the active microphone such that vibration sensed by the active microphone is sensed by the vibration sensor; and a signal processor communicatively coupled to receive a signal sigA output from the active microphone and a signal sigB output from the vibration sensor and to transmit a signal sigfinal to the CVR, wherein the signal processor comprises: a subtractor configured to output, to the CVR, the signal sigfinal as a result of a subtraction of the signal sigB from the signal sigA.

The vibration sensor may comprise at least one of a micro-electromechanical systems (MEMS) microphone and a MEMS accelerometer.

The vibration sensor may comprise the MEMS microphone co-mounted with the active microphone such that a sensitive axis of the MEMS microphone is aligned with a sensitive axis of the active microphone The vibration sensor may comprise the MEMS accelerometer configured to output a signal corresponding to an axis aligned with a sensitive axis of the active microphone.

The signal processor may further comprise a digital/analog converter configured to convert a digital signal sigfinal, received from the subtractor, into an analog signal sigfinal, and to transmit the analog signal sigfinal to the CVR.

The processor may further comprise at least one adjustable delay disposed on one of a signal path between the active microphone and the digital subtractor and a signal path between the vibration sensor and the digital subtractor.

The signal processor may further comprise a first bandpass filter disposed on the signal path between the active microphone and the digital subtractor and second bandpass filter disposed on a signal path between the vibration sensor and the digital subtractor.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
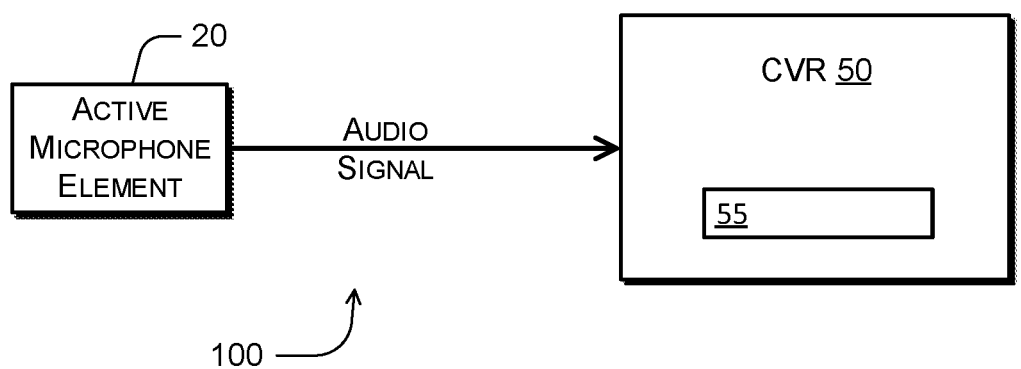
FIG. 1 is a schematic diagram of a related art aircraft recording system.

Reference will now be made in detail to example embodiments which are illustrated in the accompanying drawings, wherein like reference numerals refer to like elements throughout. In this regard, the example embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., may be used herein to describe various elements, components, regions, layers and/or sections, these elements, components, regions, layers and/or sections may not be limited by these terms. These terms are only used to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

FIG. 1 is a schematic diagram of a related art aircraft recorder system 100 including an active microphone 20 operatively coupled to a CVR 50. According to an alternate aspect, the active microphone may be a functional part of the CVR itself. The active microphone 20, which may be a CAM, is mounted within the cockpit of an aircraft and outputs an audio signal to a processor 55 of the CVR 50. Any handling noise picked up by the active microphone 20 is included in the audio signal transmitted to the CVR 50.

Figure 2:
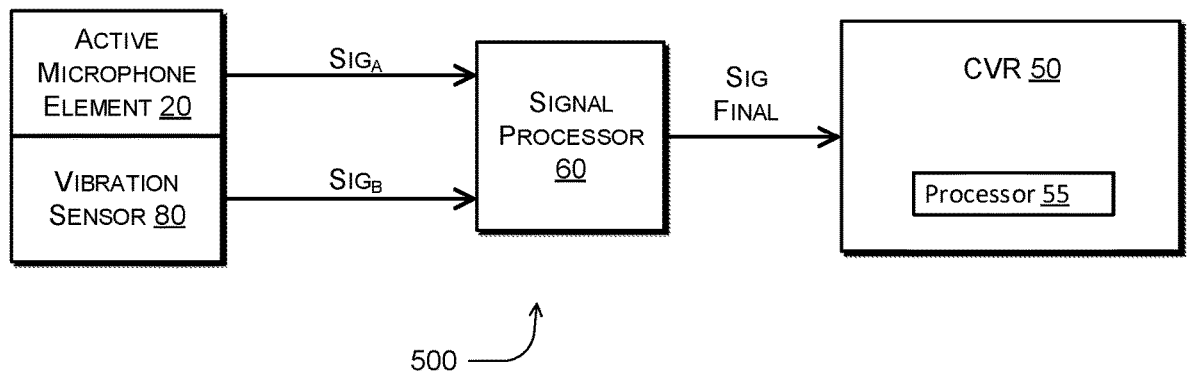
FIG. 2 is a schematic diagram of an aircraft recording system according to an example embodiment.

FIG. 2 is a schematic diagram of an aircraft recorder system 500 according to an example embodiment. As shown in FIG. 2, a vibration sensor 80 comprising one or more of a micro-electromechanical systems (MEMS) accelerometer and a sealed MEMS microphone is co-located with the active microphone 20. MEMS are made up of components of about 1 to 100 micrometers in size, and generally range in size between about 20 micrometers to a millimeter. A MEMS usually consists of a central unit that processes data, such as a microprocessor or other integrated circuit chip, and components that interact with the surroundings, such as an accelerometer. A MEMS accelerometer is used to measure linear motion, e.g. movement, shock, or vibration, without a fixed reference. A MEMs accelerometer measures the linear acceleration of whatever it is attached to. A MEMS microphone is a transducer that converts sound into an electrical signal and consists of a microphone chip or silicon microphone with a pressure-sensitive diaphragm etched directly into a silicon wafer by MEMS processing techniques.

The MEMS accelerometer and/or the MEMs microphone of the vibration sensor 80 are co-located with the active microphone 20 or are mounted together with the active microphone 20 such that the MEMS accelerometer 30 and/or the MEMs microphone 40 sense any accelerations also transmitted to the active microphone 20 which may cause handling noise in the microphone element signal sigA. In the case of a MEMs microphone, the accelerations sensed by the microphone would likewise result in handling noise in any signal $sig_{Bmic}$ output from the MEMs microphone. In the case of a MEMs accelerometer, the accelerations sensed by the accelerometer would be reflected in the signal $sig_{Bacc}$ output from the MEMs accelerometer.

In the case of an accelerometer, the accelerometer may be a single-axis accelerometer having a sensitive axis aligned with the sensitive axis of the active microphone 20. The accelerometer may alternately be a multi-axis accelerometer. In this case, the accelerometer and may be configured to output a signal based only on an axis aligned with the axis of the active microphone 20, or a filter (not shown), may be included on a signal path B from the accelerometer and/or the microphone, to pass only the signal corresponding to the axis aligned with the sensitive axis of the active microphone 20.

In the case of a microphone, the sensitive axis of the microphone is aligned with that of the active microphone 20. An audio port of the microphone may be blocked to eliminate ambient audio noises.

Figure 3:
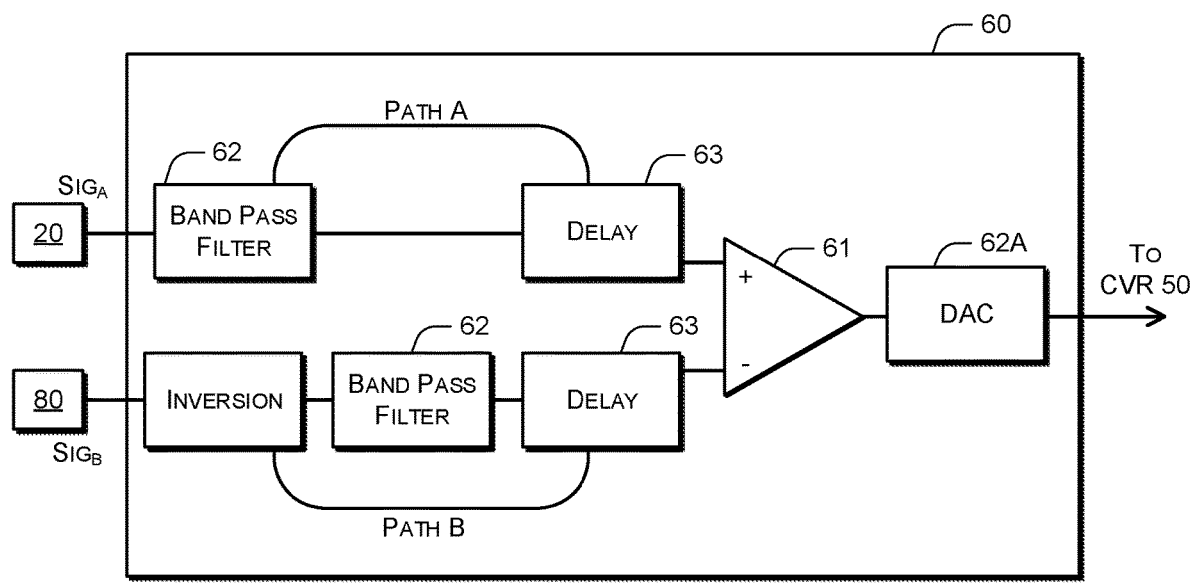
FIG. 3 is a schematic diagram of an example signal processor of the system of FIG. 2.

The active microphone 20, and MEMS accelerometer and/or MEMS microphone are coupled to at least one signal processor 60 configured to subtract the handling noise from the total detected audio signal $sig_A$ output from the active microphone 20 based on a signal from the co-located accelerometer and/or microphone. FIG. 3 is a schematic diagram of a signal processor 60 according to an example embodiment. The signal processor 60 includes a digital signal subtractor 61, configured to subtract a signal from the vibration sensor 80 from a signal received from the active microphone 20. The signal processor 60 may also include a digital/analog converter 62A to convert a signal from the subtractor 61 to an analog signal. One or more analog to digital converters (not shown) may also be included in the signal processor 60, on one or both of the signal path A from the active microphone 20 and the signal path B from the vibration sensor 80, as appropriate to the signals $sig_A$, $sig_{Bacc}$, and $sig_{Bmic}$ output from the various elements.

An active or passive band-pass filter 62 may be included in the signal processor 60 on one or both of the signal path A from the active microphone 20 and the signal path B from the vibration sensor 80.

The signal processor 60 may include processing elements (not shown) configured to adjust for phase differences between the MEMS accelerometer and/or MEMS microphone and the active microphone element. An adjustable delay in the signal processor 60 may delay the samples of interest by an integer number of sample clocks.

Figure 4:
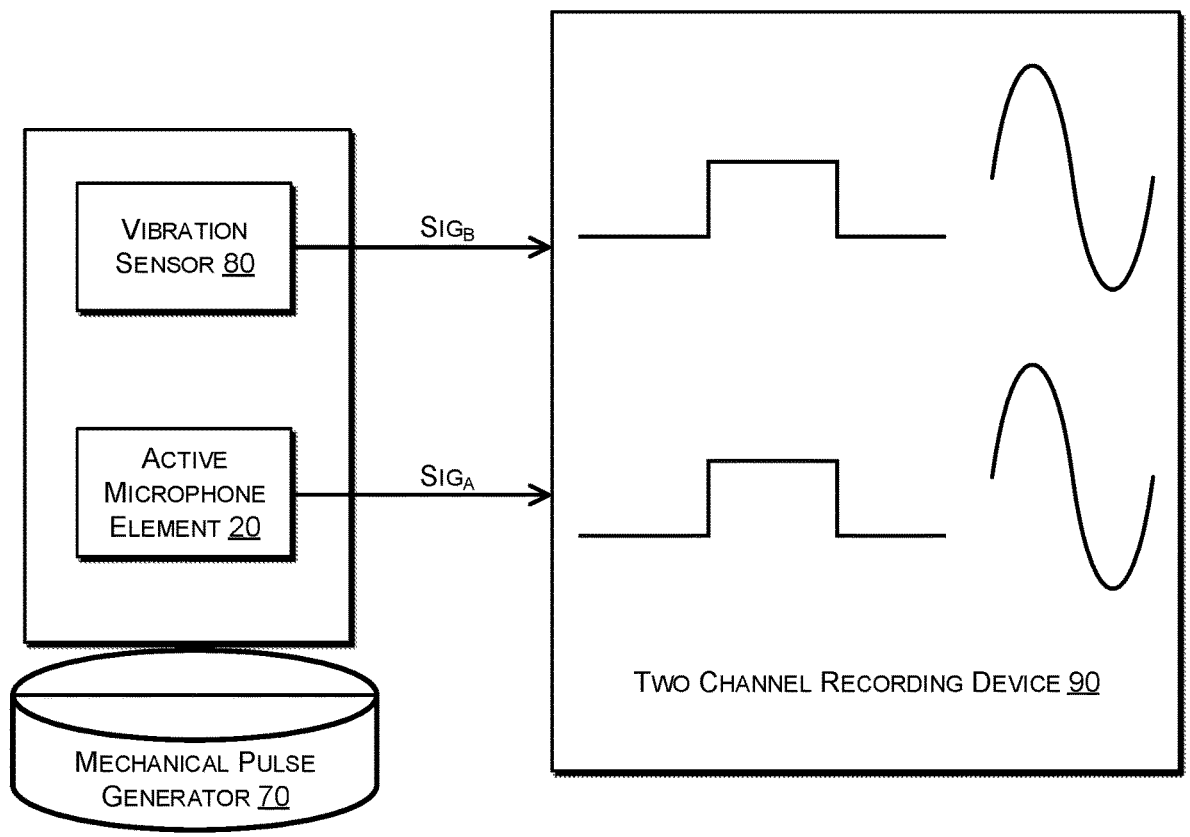
FIG. 4 is a schematic diagram of an example system for determining a delay of the signal of the system of FIG. 2.

The signal processor 60 may include one or more delay units 63, disposed on one or both of the signal path A from the active microphone 20 and the signal path B from the vibration sensor 80. A delay of the signal(s) between the active microphone 20 and the vibration sensor 80 may be determined using an example system as shown in FIG. 4. The active microphone 20 generates an audio signal $sig_A$ containing both acoustic audio and mechanically coupled vibration contributions.

The vibration sensor 80 generates mechanically coupled vibration signals $sig_B$. The vibration sensor 80 may be the accelerometer 30 or microphone 40 with the acoustic sound port closed. A mechanical pulse generator 70 may be a hammer or vibration table. The generator 70 creates a single pulse to be used to determine the delay between the microphone 20 and the vibration sensor 80. A sweep of sinusoidal vibration signals may also be used to determine if there is a frequency dependent delay factor. A two channel (stereo) audio recorder 90 is provided and the recorded audio is analyzed to determine the time delay between the two channels. This is the value for the delay block in the channel that is leading the other channel in the time domain.

The signal processor 60 may also be configured to tailor the handling noise based on frequency response. A frequency vs. coupling factor table, determined experimentally on a sensor by sensor basis, may be used to determine the negative gain characteristics.

Thus, one or more example embodiments may provide active cancelation of vibration-induced audio using signal processing in an aircraft flight recorder microphone.

It may be understood that the example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. An aircraft recorder system comprising:
a cockpit voice recorder (CVR);
an active microphone;
a vibration sensor communicatively co-mounted with the active microphone such that vibration sensed by the active microphone is sensed by the vibration sensor;
a signal processor communicatively coupled to receive a signal $sig_A$ output from the active microphone and a signal sigB output from the vibration sensor and to transmit a signal Sigfinal to the CVR, wherein the signal processor comprises:
a subtractor configured to output, to the CVR, the signal $sig_{final}$ as a result of a subtraction of the signal sigB from the signal $sig_A$; and
wherein the signal processor further comprises a first bandpass filter disposed on the signal path between the active microphone and the digital subtractor and second bandpass filter disposed on a signal path between the vibration sensor and the digital subtractor.

2. The aircraft recorder system of claim 1, wherein the vibration sensor comprises at least one of a micro-electro-mechanical systems (MEMS) microphone and a MEMS accelerometer.

3. The aircraft recorder system of claim 2, wherein the vibration sensor comprises the MEMS microphone co-mounted with the active microphone such that a sensitive axis of the MEMs microphone is aligned with a sensitive axis of the active microphone.

4. The aircraft recorder system of claim 2, wherein the vibration sensor comprises the MEMs accelerometer configured to output a signal corresponding to an axis aligned with a sensitive axis of the active microphone.

5. The aircraft recorder system of claim 1, wherein the signal processor further comprises a digital/analog converter configured to convert a digital signal $sig_{final}$, received from the subtractor, into an analog signal $sig_{final}$, and to transmit the analog signal $sig_{final}$ to the CVR.

6. The aircraft recorder system of claim 1, wherein the signal processor further comprises at least one adjustable delay disposed on one of a signal path between the active microphone and the digital subtractor and a signal path between the vibration sensor and the digital subtractor.

* * * * *